United States Patent
Guosheng (10) Patent No.: US 6,762,560 B1
(45) Date of Patent: Jul. 13, 2004

(54) HIGH SPEED OVER-SAMPLER APPLICATION IN A SERIAL TO PARALLEL CONVERTER

(75) Inventor: Wu Guosheng, Singapore (SG)

(73) Assignee: Nano Silicon Pte. Ltd., Singapore (SG)

( * ) Notice: Subject to any disclaimer, the term of this patent is extended or adjusted under 35 U.S.C. 154(b) by 0 days.

(21) Appl. No.: 10/341,138

(22) Filed: Jan. 13, 2003

(51) Int. Cl.[7] .............................................. H03M 9/00
(52) U.S. Cl. ......................................... 314/101; 341/100
(58) Field of Search ................................. 341/101, 100

(56) References Cited

U.S. PATENT DOCUMENTS

| | | | | |
|---|---|---|---|---|
| 4,799,040 A | * | 1/1989 | Yanagi | 341/101 |
| 5,561,423 A | | 10/1996 | Morisaki | 341/100 |
| 5,598,056 A | * | 1/1997 | Jin et al. | 313/495 |
| 5,648,776 A | * | 7/1997 | Widmer | 341/100 |
| 5,777,567 A | | 7/1998 | Murata et al. | 341/100 |
| 5,808,571 A | * | 9/1998 | Kuwata et al. | 341/100 |
| 6,052,073 A | | 4/2000 | Carr et al. | 341/100 |
| 6,169,501 B1 | * | 1/2001 | Ryan | 341/101 |
| 6,259,387 B1 | | 7/2001 | Fukazawa | 341/100 |

* cited by examiner

*Primary Examiner*—Michael Tokar
*Assistant Examiner*—Lam T. Mai
(74) *Attorney, Agent, or Firm*—George O. Saile; Stephen B. Ackerman (57) ABSTRACT

The present invention is a serial to parallel data conversion method and device where new serial data are stored within a first n-bit register prior to presentation at an n-bit parallel output. Subsequently, additional data are stored within a second n-bit register while the data stored within the first register are presented at the parallel output. Data storage and data presentation are thereafter alternated, thereby eliminating the problem of setup time seen in prior art.

9 Claims, 6 Drawing Sheets

HIGH SPEED OVER-SAMPLER APPLICATION IN A SERIAL TO PARALLEL CONVERTER

BACKGROUND OF THE INVENTION (1) Field of the Invention

The invention generally relates to a method used in semiconductor manufacturing and, more particularly, to a serial to parallel data converter used in the fabrication of integrated circuits (ICs).

(2) Description of Prior Art

Serial to parallel data converters have numerous applications in electronics including circuitry where serial data from a disk or CDROM are converted to parallel format to be processed within a computer. As processing speeds increase and memory sizes grow, there is a need to reduce the time necessary to convert data from serial to parallel format.

Figure 1:
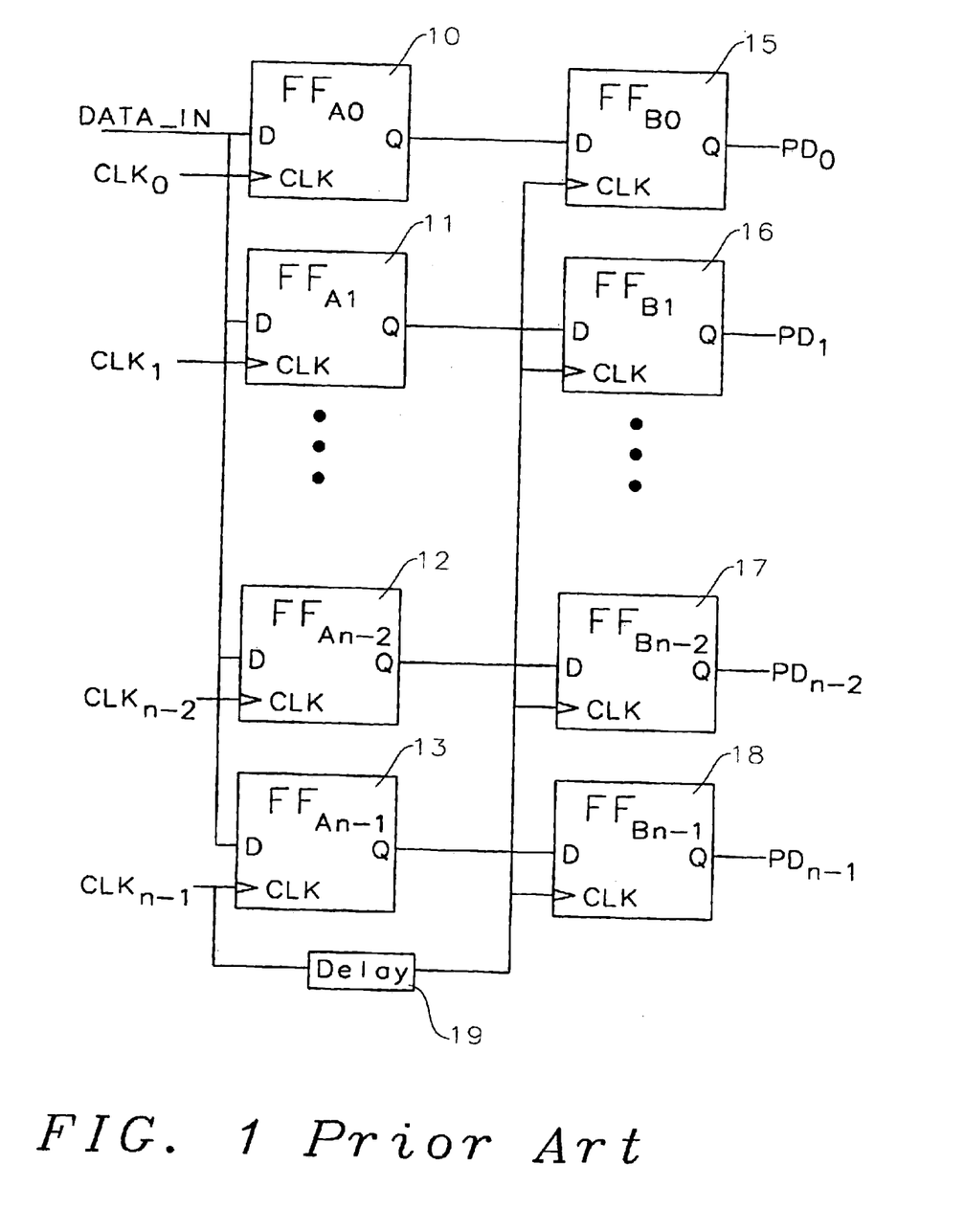
FIG. 1 schematically illustrating a block diagram representation of a typical serial to parallel data conversion system.

Refer now to FIG. 1 showing a typical serial to parallel data converter. A plurality (n) of first D flip-flops ($DFF_A$) 10–13 are provided. A serial data stream (DATA_IN) is applied to the input of each $DFF_A$ 10–13. A plurality (n) of phase clocks are applied to the corresponding clock input of each latch 10–13 such that $CLK_0$ is applied to $DFF_{A0}$, $CLK_1$ is applied to $DFF_{A1}$, etc. The output of each $DFF_A$ 10–13 is connected to the input of a corresponding second D flip-flop ($DFF_B$) 15–18. $CLK_{n-1}$ is connect through a delay 19 to each clock inputs of $DFF_B$ 15–18. The outputs of each $DFF_B$ 15–18 correspond to parallel data $PD_0$ through $PD_{n-1}$. The operation of the circuit of FIG. 1 is as follows. DATA_IN are applied to the plurality of $DFF_A$ (10–13). On the rising edge (for example) of each phase clock ($CLK_0$–$CLK_{n-1}$) the corresponding serial data bit is stored on the output of its respective $DFF_A$. Once all n data bits are stored, the clock inputs of each $DFF_B$ 15–18 are simultaneously triggered and the data are then transferred to the corresponding parallel data output $PD_0$ through $PD_{n-1}$. The parallel data are then ready for use. The process is repeated and when the next n data bits are received, new parallel data appear at the output.

The problem with this circuit is that as speeds increase, the DFFs 15–18 may not be able to load properly before the next data bit is latched into $DFF_{A0}$ 10. Additionally, as serial data speeds increase, the processor using the parallel data may not be able to keep up with the presentation of parallel data. Thus, the serial data transfer must be stopped until the processor is ready to accept more parallel data. It is therefore necessary to find a better method to transfer serial to parallel data.

Other approaches related to improving serial to parallel data conversion circuits exist. U.S. Pat. No. 6,259,387 B1 to Fukazawa describes a serial-parallel converter, which uses a plurality of data extraction units, a delay unit and parallel registers for storing data for parallel distribution. U.S. Pat. No. 6,052,073 to Carr et al. discloses a serial-parallel converter using a shift register, a parallel latch and a controller for enabling and synchronizing the data stream. U.S. Pat. No. 5,777,567 to Murata et al. shows a serial-parallel converter using a delay line and phase locked loop (PLL) to synchronize the data. U.S. Pat. No. 5,561,423 to Morisaki describes a serial-parallel converter operating at high-speed and low power dissipation and utilizing differential flip-flops.

SUMMARY OF THE INVENTION

A principal object of the present invention is to provide a serial to parallel data conversion method utilizing a high-speed clock and high data rate application.

Another object of the present invention is to provide a serial to parallel data conversion circuit utilizing a high-speed clock and high data rate application.

A further object of the present invention is to provide a serial to parallel data conversion method that avoids the problem of setup between parallel loading of data and latching of the next serial data bit.

A still further object of the present invention is to provide a serial to parallel data conversion circuit that avoids the problem of setup between parallel loading of data and latching of the next serial data bit.

These objects are achieved using a serial to parallel data conversion method and circuit where the first serial data word is stored within a first n-bit register prior to presentation at the n-bit parallel output. The second serial data word is stored within a second n-bit register while the first serial data word stored within the first register is presented in parallel format at the output. The third serial data word is then stored within the first n-bit register while the second serial data word stored within the second register is presented at the output. Thus odd serial data words are stored within the first n-bit register while the contents of the second n-bit register are output and even serial data words are stored within the second n-bit register while the contents of the first n-bit register are output. By alternating data storage and data presentation the problem with setup time observed in prior art is eliminated.

BRIEF DESCRIPTION OF THE DRAWINGS

In the accompanying drawings forming a material part of this description, there is shown.

DESCRIPTION OF THE PREFERRED EMBODIMENTS

Figure 2:
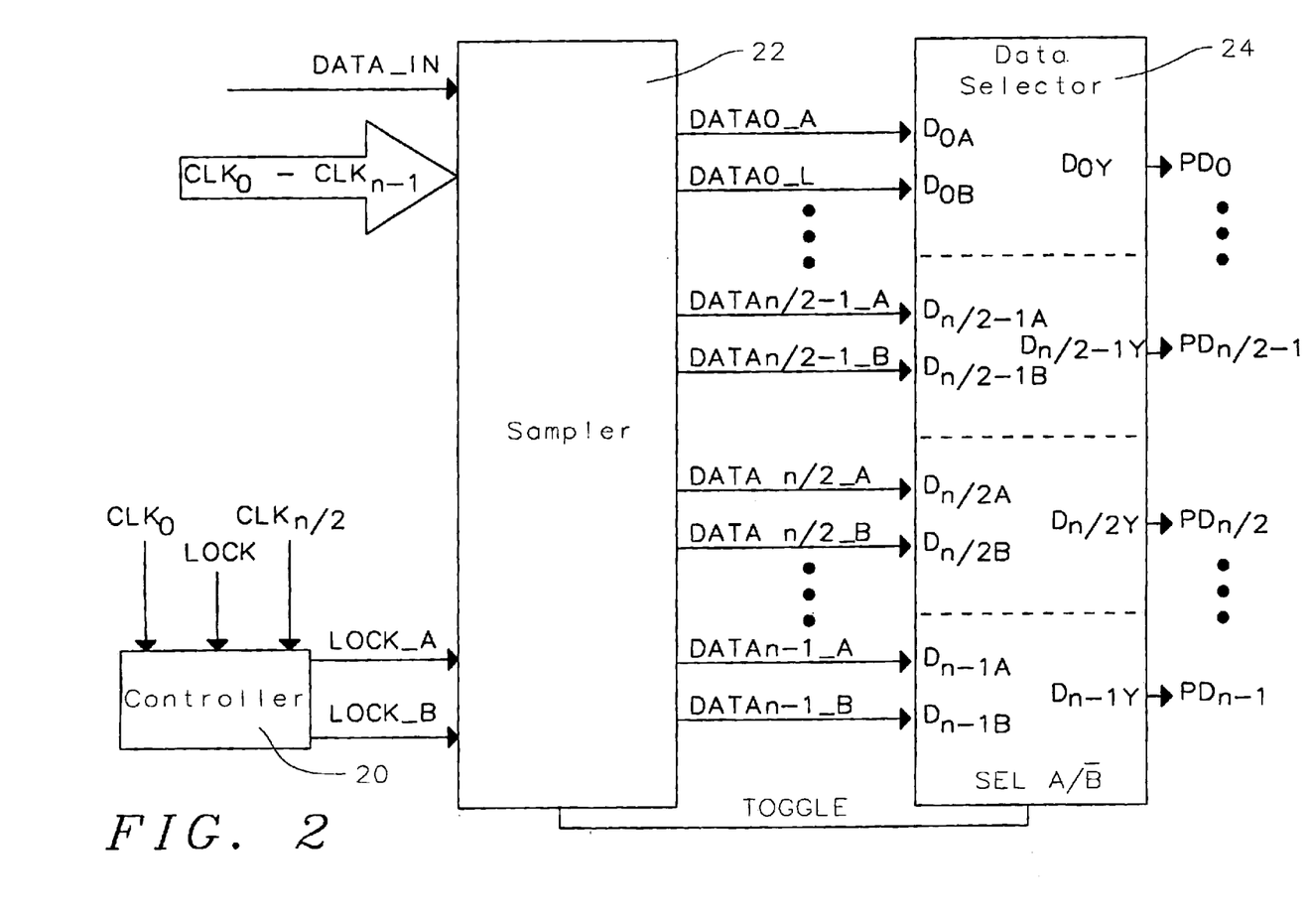
FIG. 2 schematically illustrating a block diagram of the serial to parallel data conversion system of the present invention.

Refer now to FIG. 2, depicting in block diagram the serial to parallel data converter of the present invention. An n-bit converter is depicted. A controller circuit 20 is provided having inputs $CLK_0$, $CLK_{n/2}$ and LOCK. The phase locked loop (not shown) that maintains all the clocks ($CLK_0$ through $CLK_{n-1}$) generates the LOCK signal indicating that frequency lock has been achieved. The controller 20 outputs (LOCK_A and LOCK_B) are applied to the sampler circuit 22 along with the DATA_IN and clock signals ($CLK_0$ through $CLK_{n-1}$). The sampler 22 has a pair of outputs ($DATA_{X\_A}$ and $DATA_{X\_B}$) for each of the n bits of the parallel data. Additionally a TOGGLE signal is output from the sampler 22. Each of the n pairs of outputs from the sampler 22 are applied to paired inputs of the n-bit, 2 to 1, data selector 24. The TOGGLE signal is applied to the (A/!B) select input (A/!B) of the data selector 24.

An overview of the operation of the present invention of FIG. 2 will now be discussed with additional details to follow. In the example, a rising clock edge is assumed to be the trigger, however those skilled in the art will realize that a falling edge could be used without changing the intent of the invention.

The sampler 22 has two n-bit registers A and B having outputs $DATA_{0\_A}$ through $DATA_{n-1\_A}$ and $DATA_{0\_B}$ through $DATA_{n-1\_B}$, respectively. If the phase locked loop is not properly synchronized with the data stream, the LOCK signal will be low and the two registers will be cleared. Once a LOCK signal is indicated from the phase locked loop, LOCK_A will go high on the $CLK_0$ edge. As each $CLK_X$ edge is presented the corresponding bit of the first n/2 bits of the first serial data word (DATA_IN) is stored in the first sampler register. On the edge of $CLK_{n/2}$, LOCK_B will go high and as each $CLK_X$ edge is presented the corresponding bit of the next n/2 bits of the first serial data word (DATA_IN) will be stored internally to the lower half of the first sampler register. Once all n bits have been stored in the first sampler register, the subsequent $CLK_X$ edges will store the second n-bits of the serial data word (DATA_IN) in the second sampler register. Additionally, on the next $CLK_0$ edge, TOGGLE will become high so that $DATA_{0\_A}$ through $DATA_{n-1\_A}$ are selected by the data selector 24 and will then appear at the corresponding $PD_X$ output of the data selector 24. Once the second register is filled, the third serial data word will be stored to the first register, TOGGLE will go low so that $DATA_{0\_B}$ through $DATA_{n-1\_B}$ are selected by the data selector 24 and will then appear at the corresponding $PD_X$ output of the data selector 24. The process is repeated with odd and even serial data words alternately being stored to the first or second sampler register, respectively. By doing this, the data has time to setup prior to parallel reading.

Figure 3:
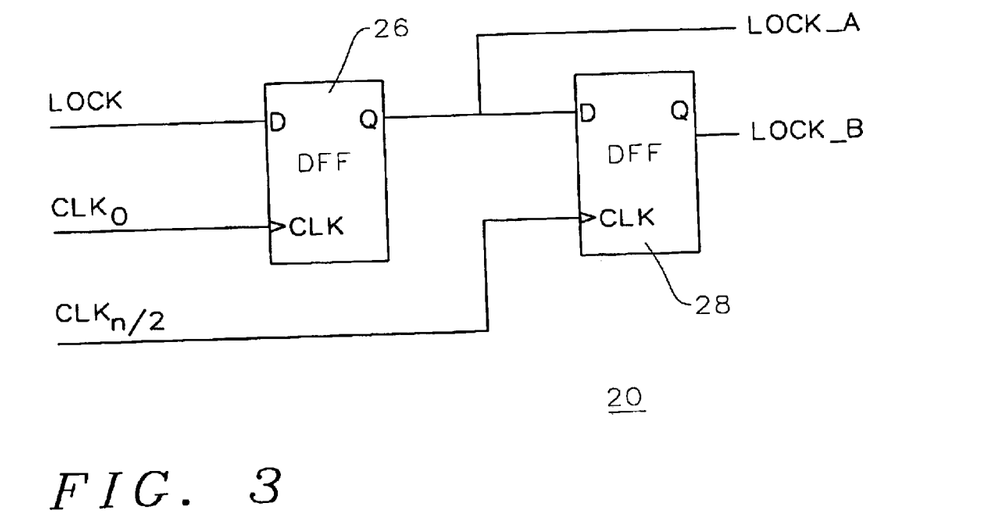
FIG. 3 illustrating a schematic representation of controller block of the serial to parallel data conversion system used in FIG. 2.
Figure 4:
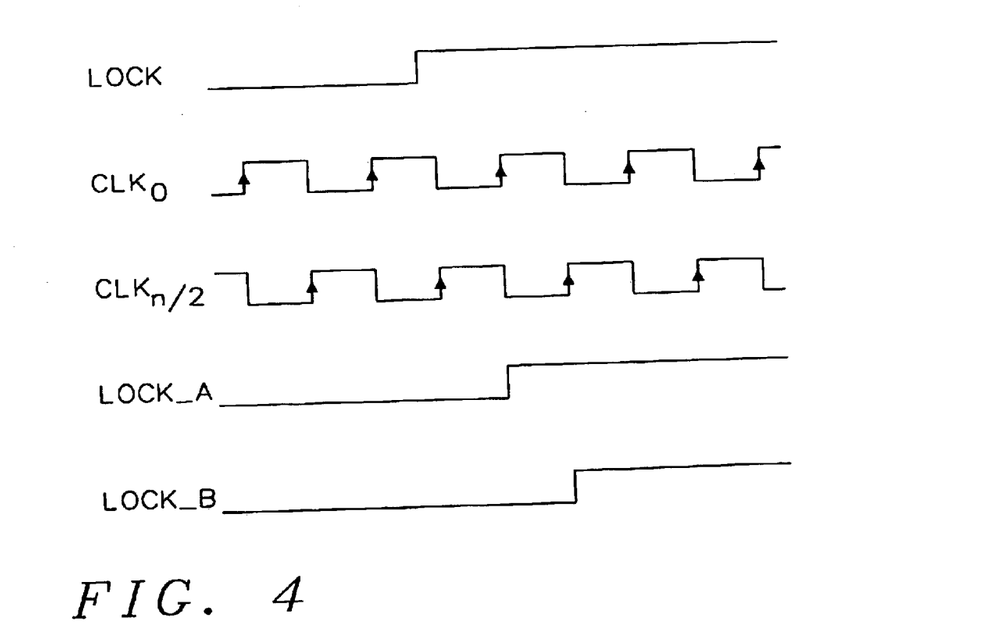
FIG. 4 illustrating a timing diagram for the controller clock of FIG. 3.

Refer to FIG. 3 showing the circuit for the controller block 20. A first DFF 26 has the LOCK signal applied to the D input and the $CLK_0$ signal applied to the clock (CLK) input. The output of the first DFF 26 (LOCK_A) is applied to the D input of the second DFF 28. $CLK_{n/2}$ provides the clock (CLK) input of the second DFF 28. The output of the second DFF 28 is LOCK_B. Referring now to the timing diagram of FIG. 4 and the circuit of FIG. 3, the operation of the controller will now be provided. Prior to the LOCK signal going high, LOCK_A will be low on each edge of $CLK_0$. Since LOCK_A provides the D input to the second DFF 28, whenever LOCK_A is low, LOCK_B will be low on each edge of $CLK_{n/2}$. Once a phase locked loop lock condition is achieved, LOCK will go high and LOCK_A will become high on the next edge of $CLK_0$. Thereafter LOCK_B will become high on the next edge of $CLK_{n/2}$.

Figure 5:
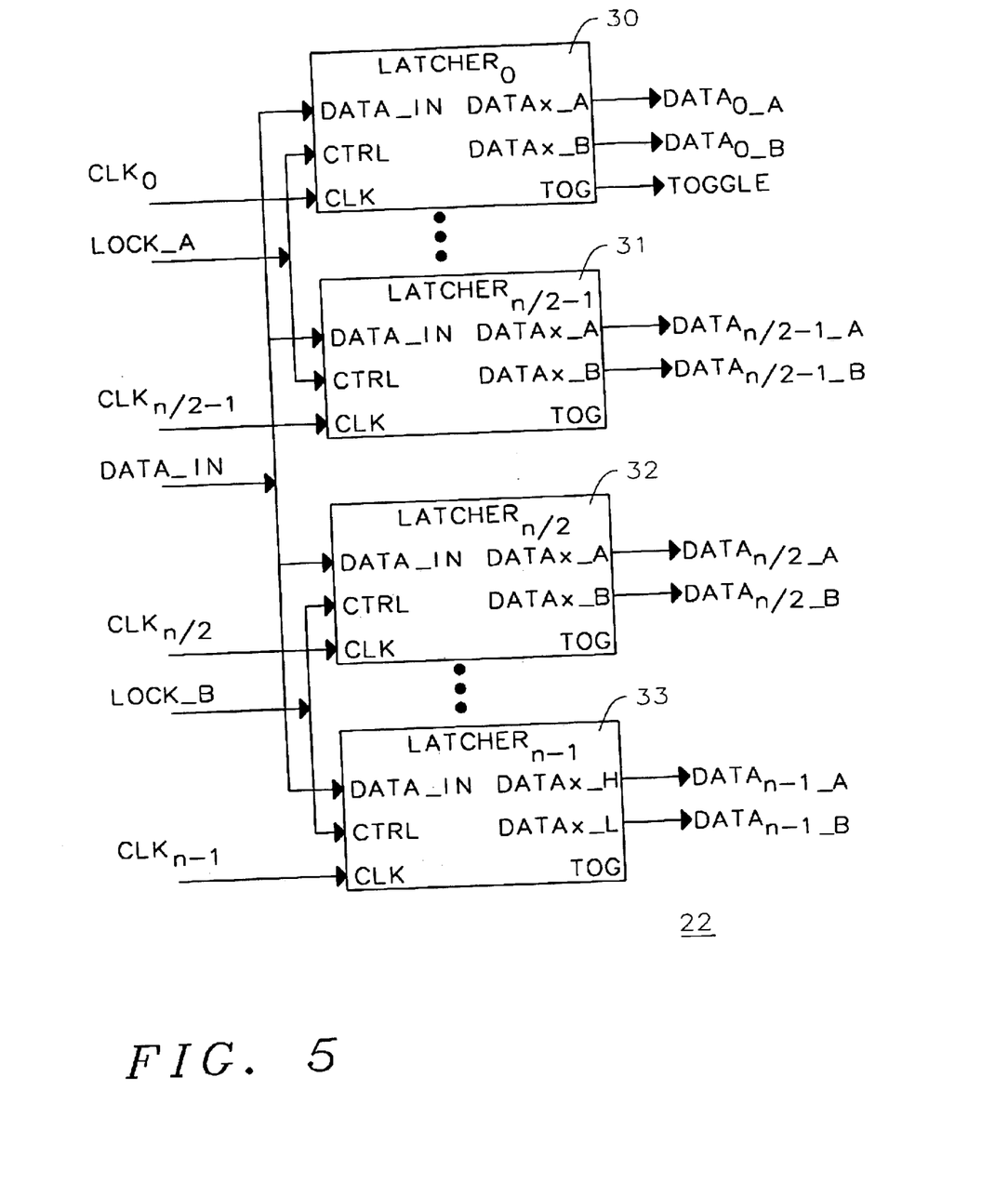
FIG. 5 illustrating a block diagram of the sampler block of the serial to parallel data conversion system used in FIG. 2.

Refer now to FIG. 5, showing a block diagram of the sampler 22 of the present invention. A plurality of n LATCHER blocks 30–33 are provided. Each LATCHER block 30–33 has an input tied to the DATA_IN signal line. Each $LATCHER_X$ 30–33 has a corresponding $CLK_X$ applied to a CLK input. The first n/2 LATCHERs 30–31 have a control input (CTRL) with LOCK_A applied, while the remaining n/2 LATCHERs 32–33 have the control input (CTRL) connected to LOCK_B. Each $LATCHER_X$ 30–33 has a pair of outputs ($DATA_{X\_A}$ and $DATA_{X\_B}$) and a TOG output, with $TOG_0$ (from $LATCHER_0$) providing the TOGGLE signal used by the data selector 24. The LOCK_A and LOCK_B signals assure that all the TOG bits in each LATCHER block 30–33 are properly set, thus avoiding any possible mistake in latching during the initial data capture. Thereafter, the TOG bits will toggle between logic states.

Figure 6:
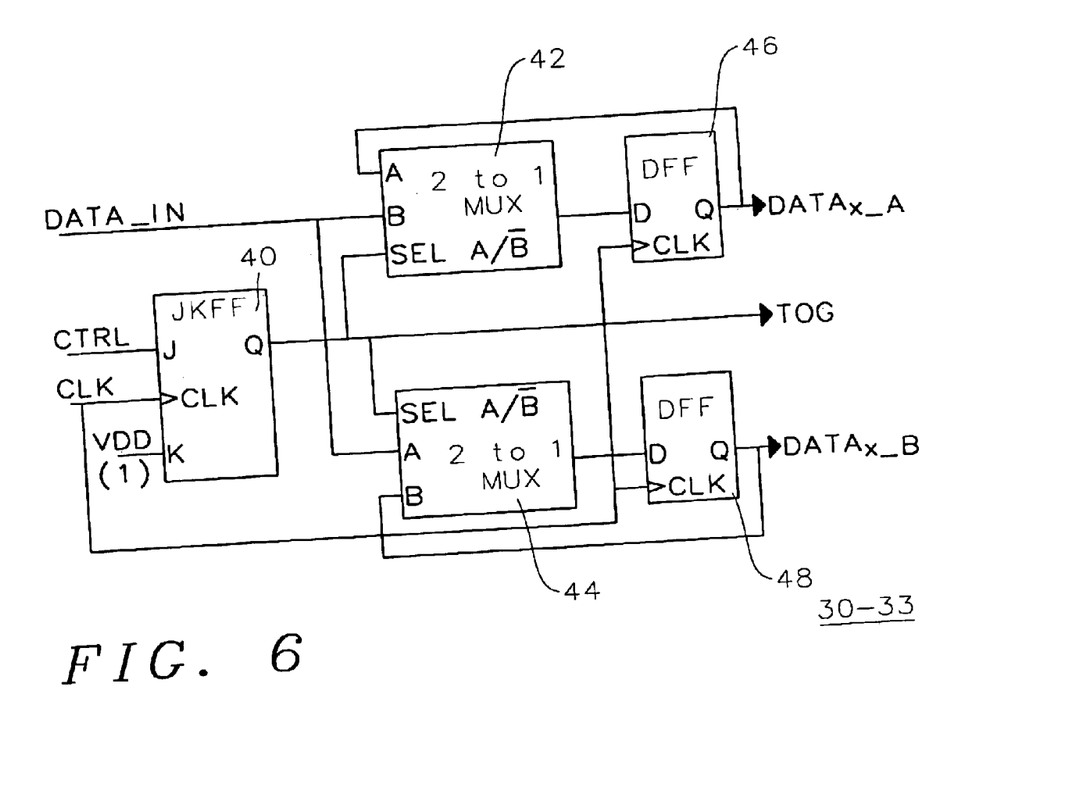
FIG. 6 illustrating a schematic representation of the latcher block used in the sampler block of FIG. 5.

Referring now to FIG. 6, the detailed circuitry of the LATCHER block 30–33 is now discussed. A JK flip-flop (JKFF) 40 is provided. The JKFF 40 has the J input connected to the CTRL signal (either LOCK_A or LOCK_B) while the K input is tied high. The CLK input of the JKFF and a first and second DFF (46 and 48, respectively) are connected to the $CLK_X$ signal. The output of the JKFF 40 is the signal TOG that is in turn applied to the select inputs (SEL A/!B) of a first and second 2:1 multiplexer or MUX (42 and 44, respectively). The first MUX 42 is connected such that the DATA_IN (serial data) signal is applied to the B input and the output (Q) of the first DFF 46 is applied to the A input. The second MUX 44 is connected such that the DATA_IN (serial data) signal is applied to the A input and the output (Q) of the second DFF 48 is applied to the B input. The output (Q) of the first DFF 46 is $DATA_{X\_A}$ of the $LATCHER_X$, and the output (Q) of the second DFF 48 is $DATA_{X\_B}$ of the $LATCHER_X$.

Still referring to FIG. 6, the operation of the LATCHER block 30–33 is now described. Initially the CTRL input (from either LOCK_A or LOCK_B) is low. Therefore on each edge of $CLK_X$ the output of the JKFF 40 (TOG) is reset (logic 0). This selects the B inputs from the first and second MUX 42 and 44. This applies DATA_IN to the D input of the first DFF 46 and $DATA_{X\_B}$ to the D input of the second DFF 48. Thus on each $CLK_X$ edge DATA_IN and $DATA_{X\_B}$ are refreshed upon the Q outputs of DFFs 46 and 48, respectively. Once PLL lock is achieved the CTRL signal will go high (1). On the first subsequent rising edge of $CLK_X$ valid DATA_IN will be stored on the Q output ($DATA_{X\_A}$) of the first DFF 46 and $DATA_{X\_B}$ is refreshed on the Q output of second DFF 48. Simultaneously, TOG will become high (logic 1). On the second subsequent rising edge of $CLK_X$ valid DATA_IN will be stored on the Q output ($DATA_{X\_B}$) of the second DFF 48, $DATA_{X\_A}$ is refreshed on the Q output of the first DFF 46 and TOG will become low (logic 0). Thus on each $CLK_X$ edge whenever CTRL is high, TOG will toggle between 0 and 1, and the valid DATA_IN will be stored on one of the two DFF Q outputs while the other DFF Q output is refreshed.

Figure 7:
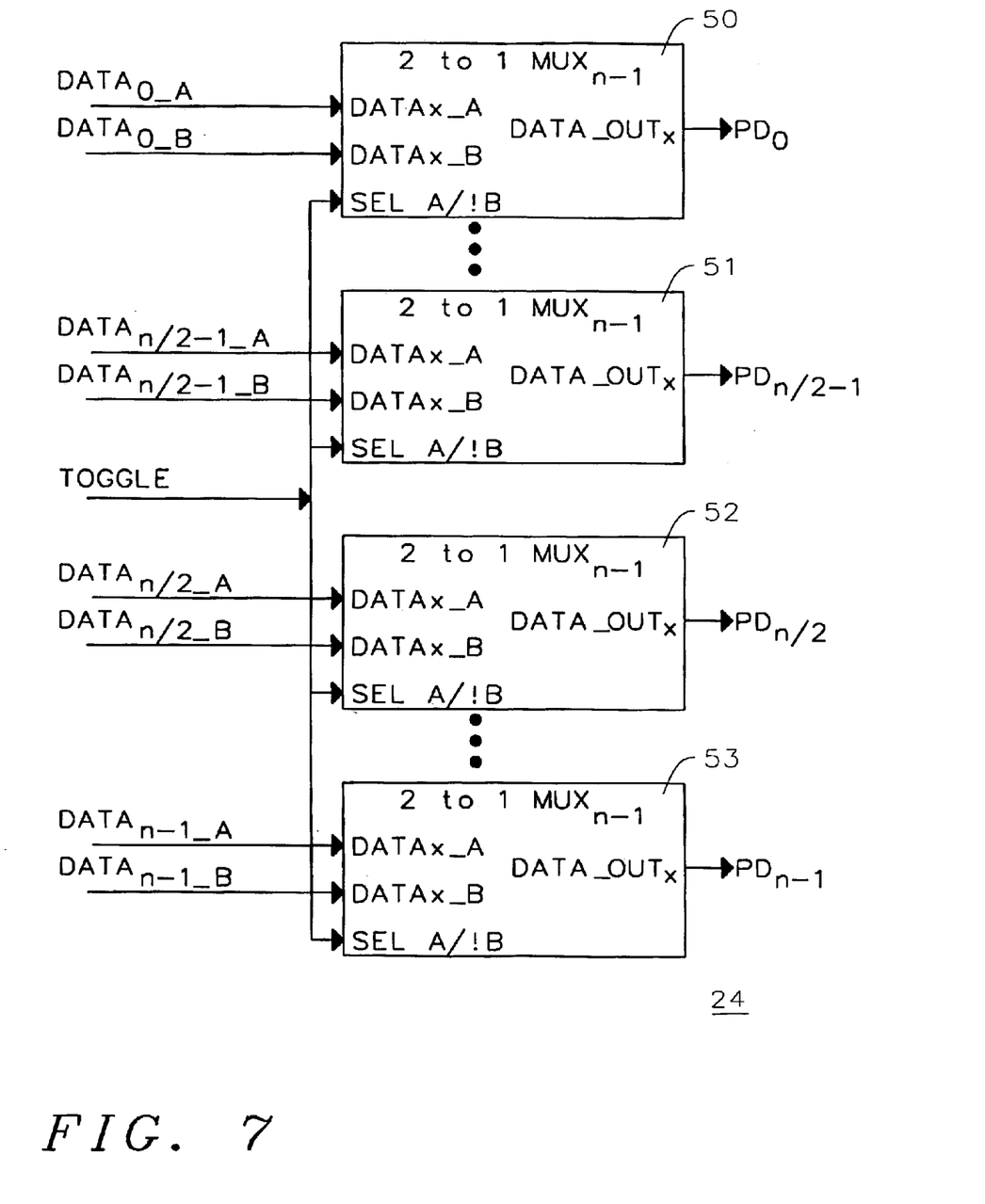
FIG. 7 illustrating a schematic representation of the data selector block used in FIG. 2 of the present invention.

Refer now to FIG. 7, showing the circuitry of the data selector 24. There are a plurality, n, of 2 to 1 multiplexers (MUX) 50–53. Each MUX 50–53 has a pair of data inputs $DATA_{X\_A}$ and $DATA_{X\_B}$. The input that appears at the output ($PD_X$) is selected by a common select input (SEL A/!B) such that when SEL is low the $DATA_{X\_B}$ input will appear at $PD_X$ and when SEL is high the $DATA_{X\_A}$ input will appear at $PD_X$.

With all of the blocks of the serial to parallel data system described, the overall operation will now be described in further detail. If the phase locked loop is not properly synchronized with the data stream, the LOCK signal and the LOCK_A and LOCK_B will be low. The individual TOG signals for each LATCHER 30–33 will be low and invalid DATA_IN and $DATA_{X\_B}$ are refreshed upon the Q outputs of DFFs 46 and 48, respectively. Since $TOG_0$ is low and applied to the SEL input of the data selector 24, the output of the data selector 24 will be $DATA_{X\_B}$. Once the phase locked loop LOCK is achieved (1), LOCK_A and LOCK_B will become high on $CLK_0$ and $CLK_{n/2}$ respectively. With the first $CLK_X$ after LOCK_A, valid serial data will be stored in the first DFF 46 within the LATCHER blocks 30–33. During this time SEL is low so that parallel output data ($PD_X$) will continue to be from the second DFFs

48. On the second $CLK_0$ edge, the SEL signal will become high and the parallel output data ($PD_x$) will be from the first DFFs 46. On the second $CLK_x$ after LOCK_A, valid serial data will be stored in the second DFF 48 within the LATCHER block 30–33. On subsequent $CLK_0$ the SEL signal will TOGGLE so that while one serial data word is being stored, the prior set is presented in parallel format at the output. By using a pair of n-bit registers to store serial data prior to being presented, the present invention solves the problem where new data is being presented to the parallel output before the previous data has stabilized.

While the invention has been particularly shown and described with reference to the preferred embodiments thereof, it will be understood by those skilled in the art that various changes in form and details may be made without departing from the spirit and scope of the invention.

What is claimed is:

1. A method of converting n-bit serial data words to parallel format comprising:
   alternately storing odd and even words of said n-bit serial data words to a first n-bit data register and second n-bit data register, respectively
   wherein each data register is comprised of n latcher blocks each of which comprises:
     a JK flip-flop with a control signal applied to the J input, a logic '1' applied to the K input and a Q output generating a toggle signal;
     a first D flip-flop with a first data output signal on the Q output and receiving the D input from the output of a first single bit two-to-one multiplexer;
     said first single bit two-to-one multiplexer where the select input comes from said toggle signal, a first input of said first data output signal from said Q output of said first flip flop and a second input of said n-bit serial data words;
     a second D flip-flop with a second data output signal on the Q output and receiving the D input from the output of a second single bit two-to-one multiplexer;
     said second single bit two-to-one multiplexer where the select input comes from said toggle signal, a first input from said n-bit serial data words and a second input of said second data output signal from said Q output of said second flip flop; and
     wherein said control signal on said first n/2 latcher blocks is connected to a first lock signal and said CTRL signal on said second n/2 latcher blocks is connected to a second lock signal and the clock inputs to said JK flip flop and said first and second D flip-flops on the $x^{th}$ latcher block are from said $x^{th}$ phase clock of said n distinct phase clocks and wherein said n first D flip-flops comprise said first n-bit data register and said second n D flip-flops comprise said second n-bit data register;
   multiplexing said first n-bit data register and said second n-bit data register to an n-bit parallel output such that
   while said odd words are being stored, presenting said even words at said parallel output; and
   while said even words are being stored, presenting said odd words at said parallel output wherein said latcher blocks in each of said first and second n-bit data registers ensure that data are stabilized before they are presented at said parallel output.

2. The method according to claim 1 wherein said storing of said odd and even words is performed a single bit at a time wherein each bit is stored in synchronism with one of n phase clocks.

3. The method according to claim 2 wherein each of said phase clocks toggles a storage select signal used to choose storage of said single bit within either said first n-bit data register or said second n-bit data register.

4. The method according to claim 2 wherein application of the first of said n phase clocks toggles said toggle signal used to select either said first n-bit data register or said second n-bit data register for presentation of data to said parallel output.

5. A device for converting n-bit serial data words to parallel format comprising:
   a data register comprising a first n-bit data register and a second n-bit data register;
   a plurality of n distinct phase clocks each having an output signal used to store one bit of said n-bit serial data words alternately to said first n-bit data register and said second n-bit data register; and
   an n-bit parallel output used to select data from either said first n-bit data register or said second n-bit data register wherein said data register comprises n latcher blocks each of which comprises:
     a JK flip-flop with a control signal applied to the J input, a logic '1' applied to the K input and a Q output generating a toggle signal;
     a first D flip-flop with a first data output signal on the Q output and receiving the D input from the output of a first single bit two-to-one multiplexer;
     said first single bit two-to-one multiplexer where the select input comes from said toggle signal, a first input of said first data output signal from said Q output of said first flip flop and a second input of said n-bit serial data words;
     a second D flip-flop with a second data output signal on the Q output and receiving the D input from the output of a second single bit two-to-one multiplexer;
     said second single bit two-to-one multiplexer where the select input comes from said toggle signal, a first input from said n-bit serial data words and a second input of said second data output signal from said Q output of said second flip flop; and
     wherein said control signal on said first n/2 latcher blocks is connected to a first lock signal and said CTRL signal on said second n/2 latcher blocks is connected to a second lock signal and the clock inputs to said JK flip flop and said first and second D flip-flops on the $x^{th}$ latcher block are from said $x^{th}$ phase clock of said n distinct phase clocks and wherein said n first D flip-flops comprise said first n-bit data register and said second n D flip-flops comprise said second n-bit data register.

6. The device according to claim 5 wherein said n-bit parallel output comprises an n-bit two-to-one multiplexer wherein said n-bits from said first data register are connected to the first n-bit inputs of said n-bit two-to-one multiplexer and said n-bits from said second data register are connected to the second input of said n-bit two-to-one multiplexer and wherein the select input for said n-bit two-to-one multiplexer is from the first of said n latcher blocks.

7. A device according to claim 5 wherein said converting n-bit serial data words to parallel format is achieved by alternately storing odd and even words of said n-bit serial data words to said first n-bit data register and said second n-bit data register, respectively; and while said odd words are being stored, said even words are presented at said n-bit parallel output; and while said even words are being stored, said odd words are presented at said n-bit parallel output.

8. A device for converting n-bit serial data words to parallel format comprising:

a data register comprising a first n-bit data register and a second n-bit data register;

a plurality of n distinct phase clocks each having an output signal used to store one bit of said n-bit serial data words alternately to said first n-bit data register and said second n-bit data register; and an n-bit parallel output used to select data from either said first n-bit data register or said second n-bit data register;

wherein said converting n-bit serial data words to parallel format is achieved by alternately storing odd and even words of said n-bit serial data words to said first n-bit data register and said second n-bit data register, respectively; and while said odd words are being stored, said even words are presented at said n-bit parallel output; and while said even words are being stored, said odd words are presented at said n-bit parallel output wherein said data register comprises n latcher blocks each of which comprises:

a JK flip-flop with a control signal applied to the J input, a logic '1' applied to the K input and a Q output generating a toggle signal;

a first D flip-flop with a first data output signal on the Q output and receiving the D input from the output of a first single bit two-to-one multiplexer;

said first single bit two-to-one multiplexer where the select input comes from said toggle signal, a first input of said first data output signal from said Q output of said first flip flop and a second input of said n-bit serial data words;

a second D flip-flop with a second data output signal on the Q output and receiving the D input from the output of a second single bit two-to-one multiplexer;

said second single bit two-to-one multiplexer where the select input comes from said toggle signal, a first input from said n-bit serial data words and a second input of said second data output signal from said Q output of said second flip flop; and wherein said control signal on said first n/2 latcher blocks is connected to a first lock signal and said CTRL signal on said second n/2 latcher blocks is connected to a second lock signal and the clock inputs to said JK flip flop and said first and second D flip-flops on the $x^{th}$ latcher block are from said $x^{th}$ phase clock of said n distinct phase clocks and wherein said n first D flip-flops comprise said first n-bit data register and said second n D flip-flops comprise said second n-bit data register.

9. The device according to claim 8 wherein said n-bit parallel output comprises an n-bit two-to-one multiplexer wherein said n-bits from said first data register are connected to the first n-bit inputs of said n-bit two-to-one multiplexer and said n-bits from said second data register are connected to the second input of said n-bit two-to-one multiplexer and wherein the select input for said n-bit two-to-one multiplexer is from the first of said n latcher blocks.

* * * * *